United States Patent
Fiedler et al.

(10) Patent No.: US 6,908,583 B2
(45) Date of Patent: Jun. 21, 2005

(54) SYSTEM AND METHOD FOR BENDING A SUBSTANTIALLY RIGID SUBSTRATE

(75) Inventors: David Fiedler, New Braunfels, TX (US); David W. Currier, McHenry, IL (US); Horace M. Long, Cibolo, TX (US); James V. Lowery, Kirby, TX (US)

(73) Assignee: Motorola, Inc., Schaumburg, IL (US)

( * ) Notice: Subject to any disclaimer, the term of this patent is extended or adjusted under 35 U.S.C. 154(b) by 229 days.

(21) Appl. No.: 10/389,105

(22) Filed: Mar. 14, 2003

(65) Prior Publication Data

US 2004/0178539 A1 Sep. 16, 2004

(51) Int. Cl.⁷ .............................................. B29C 53/04
(52) U.S. Cl. ....................... 264/319; 264/320; 264/339; 264/349; 425/384; 425/394; 425/397; 425/398
(58) Field of Search .................................. 425/394, 384, 425/397, 398; 264/319, 320, 339, 349

(56) References Cited

U.S. PATENT DOCUMENTS

| | | |
|---|---|---|
| 3,341,742 A | 9/1967 | Klehm, Jr. |
| 4,465,453 A | 8/1984 | Turner et al. |
| 4,663,208 A * | 5/1987 | Ninomiya et al. .......... 428/138 |
| 4,913,955 A | 4/1990 | Noda et al. |
| 4,958,260 A | 9/1990 | Kobayashi et al. |
| 5,008,496 A | 4/1991 | Schmidt et al. |
| 5,015,169 A | 5/1991 | Inzinna et al. |
| 5,121,297 A | 6/1992 | Haas |
| 5,144,534 A | 9/1992 | Kober |
| 5,170,326 A | 12/1992 | Meny et al. |
| 5,428,190 A | 6/1995 | Stopperman |
| 5,434,362 A | 7/1995 | Klosowiak et al. |
| 5,638,597 A | 6/1997 | Cutting et al. |
| 5,831,828 A | 11/1998 | Cutting et al. |
| 5,903,440 A | 5/1999 | Blazier et al. |
| 5,963,427 A | 10/1999 | Bollesen |
| 5,972,152 A | 10/1999 | Lake et al. |
| 5,981,870 A | 11/1999 | Barcley et al. |
| 5,998,738 A | 12/1999 | Li et al. |
| 6,012,221 A | 1/2000 | Campbell |
| 6,103,173 A | 8/2000 | Kastl et al. |
| 6,224,951 B1 | 5/2001 | Centanni et al. |
| 6,292,370 B1 | 9/2001 | Anderson et al. |
| 6,477,052 B1 | 11/2002 | Barcley |

FOREIGN PATENT DOCUMENTS

| | | |
|---|---|---|
| GB | 2 160 799 A | 1/1986 |
| JP | 09-31-4655 | 12/1997 |

OTHER PUBLICATIONS

Derwent Abstract 197934, "Metal W–shaped components cold bending set", 1979.*

* cited by examiner

Primary Examiner—Stefan Staicovici
(74) Attorney, Agent, or Firm—Thomas V. Miller; Brian M. Mancini

(57) ABSTRACT

A method and apparatus for bending a substantially rigid substrate (22) having first and second portions (28, 30) interconnected by a bend region (32). The apparatus comprises first and second heated die members (60, 80). The first heated die member (60) has a longitudinal body portion (62) and an outer edge portion (64) that extends along the longitudinal body portion (62) and is substantially rounded. The second heated die member (80) has a longitudinal body portion (82) and a groove (84) that extends along the longitudinal body portion (82). The first and second heated die members (60, 80) are configured to contact the substrate (22) and are capable of bending the substrate (22) in the bend region (32) when the outer edge portion (64) of the first heated die member (60) slides into the groove (84) of the second heated die member (80). There is also a method for bending the substantially rigid substrate (22).

19 Claims, 7 Drawing Sheets

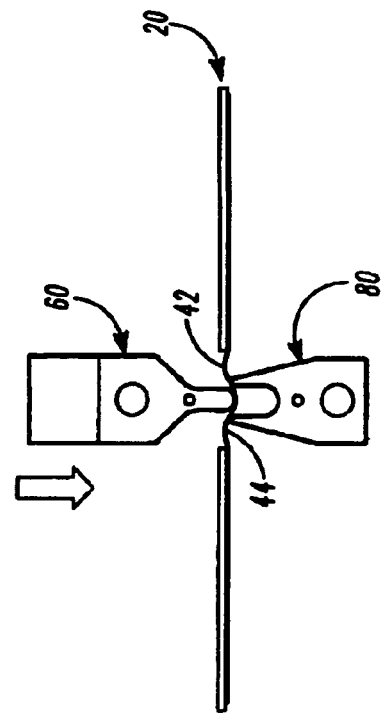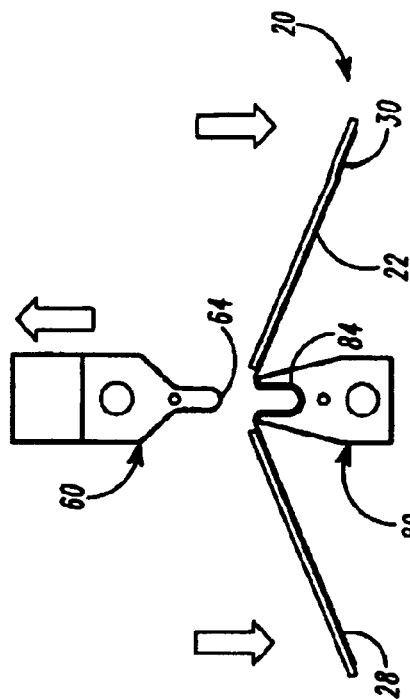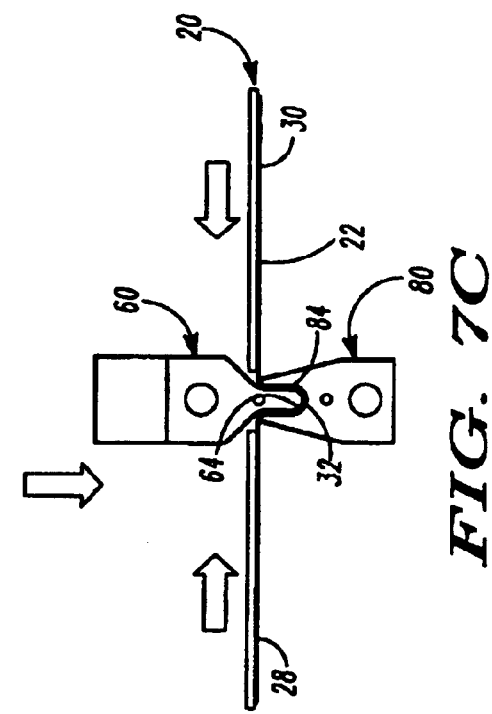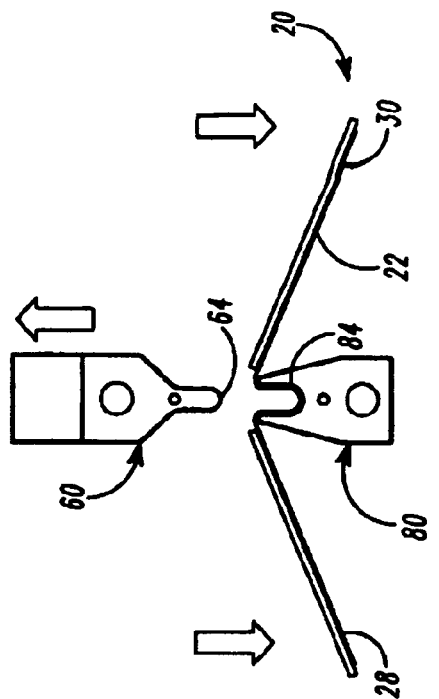
FIG. 7A
FIG. 7B
FIG. 7C
FIG. 7D

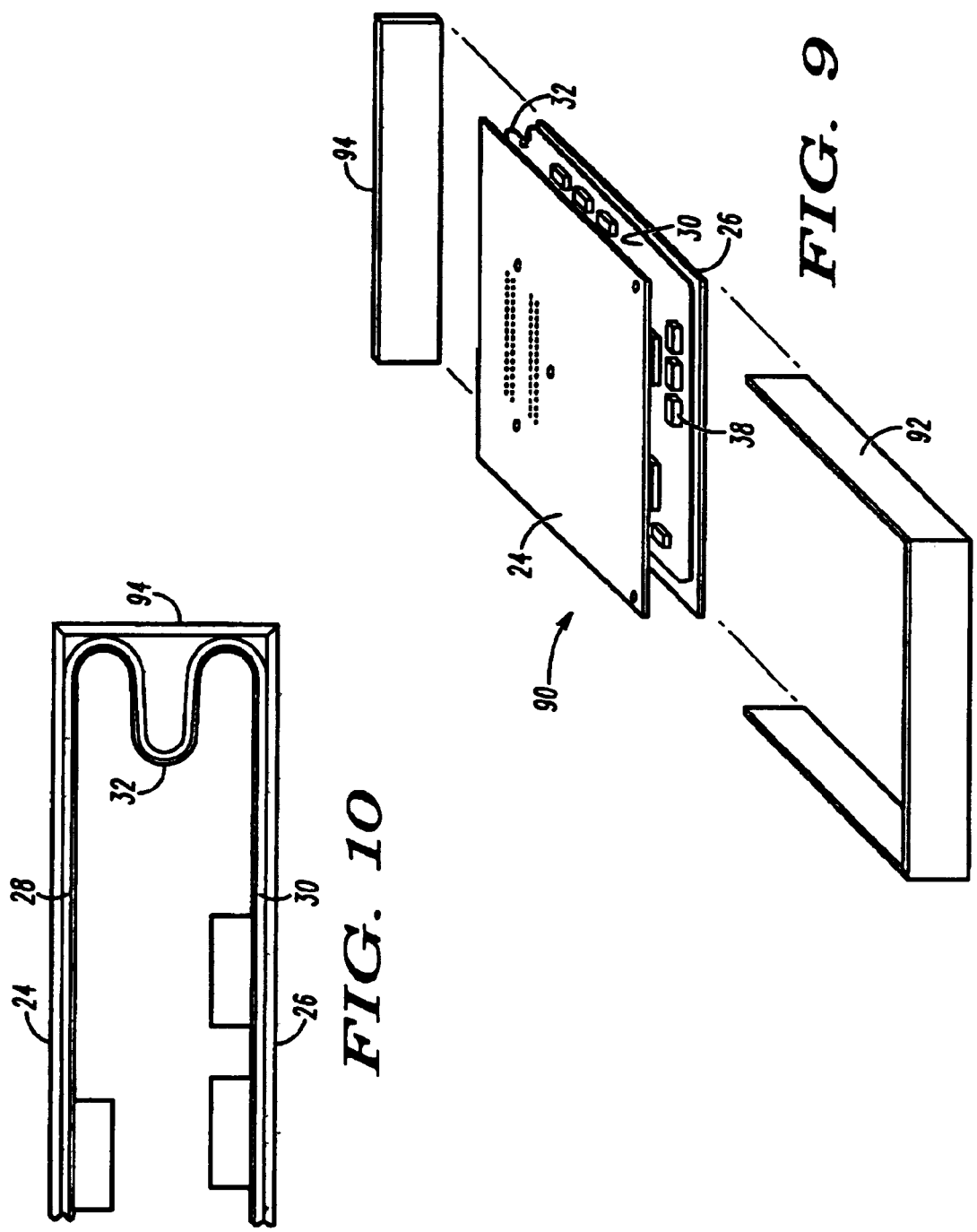

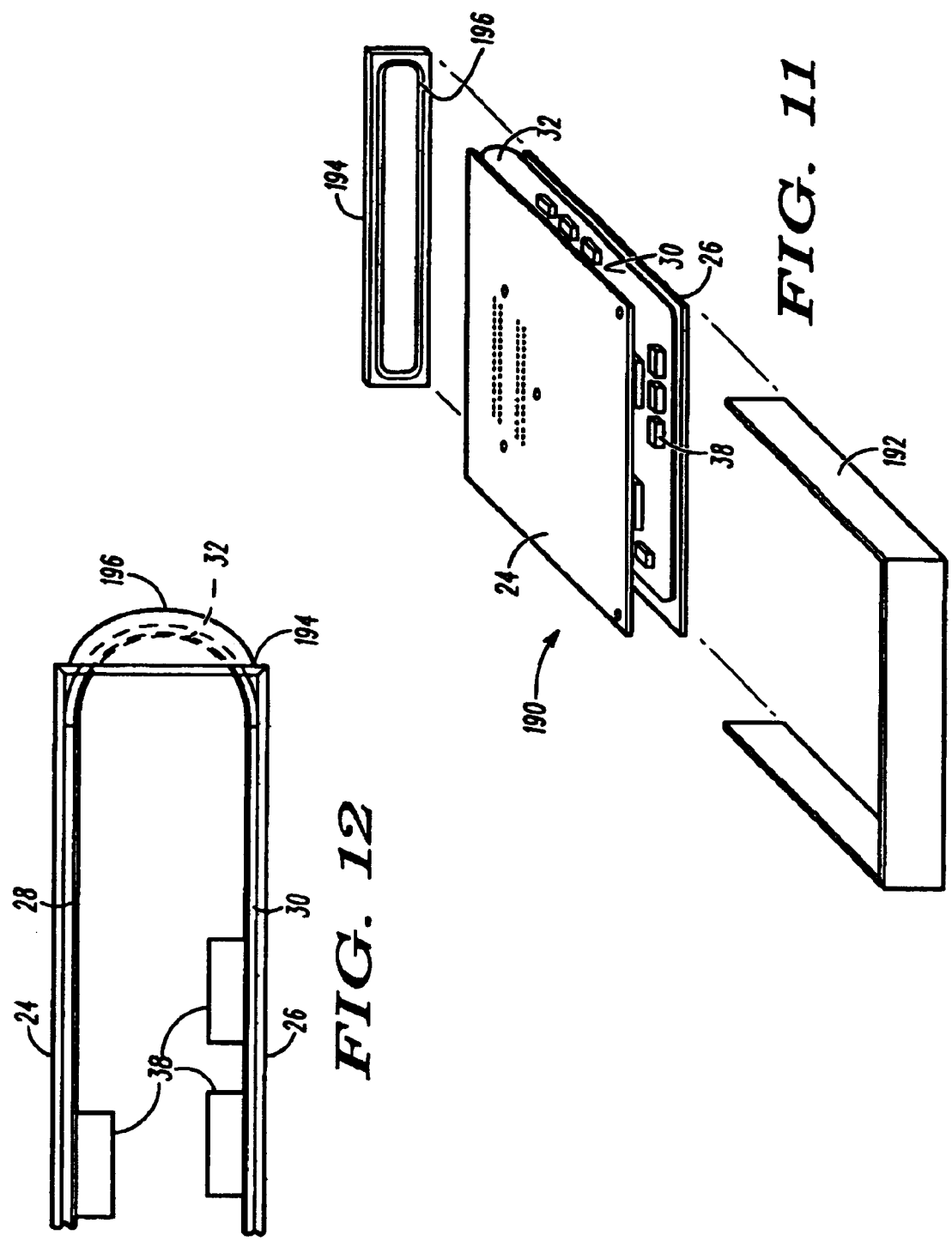

SYSTEM AND METHOD FOR BENDING A SUBSTANTIALLY RIGID SUBSTRATE

FIELD OF THE INVENTION

This invention in general relates to bending substantially rigid substrates for electronic control units and, more particularly, to a method and apparatus for bending a substrate through localized heating by different mechanisms.

BACKGROUND OF THE INVENTION

Engine mounted electronic control units for vehicular engines are subject to a high level of heat and vibration and generally disposed in a confined space. In these applications, electronic components and circuits may be formed on a relatively thin substrate that is enclosed within a rigid housing. In order to enhance thermal performance protection against engine vibration, the thin substrate is affixed to a rigidizer that may be bent to produce a reduced size module and that also functions as a heat spreader.

For example, one type of direct engine mount application uses a Polybent™ printed circuit board. This is a printed circuit board that has a flexible circuit board that is mounted to an aluminum rigidizer. The rigidizer provides mechanical support for the printed circuit board and assists in the dissipation of heat generated by components on the printed circuit board, which heat is conductively transferred from the components to the underlying rigidizer. One reference that describes an electronic control unit using a Polybent™ printed circuit board is U.S. Pat. No. 5,998,738, which is owned by the assignees of the present invention and hereby incorporated by reference herein in its entirety.

As the functionality of electronic control units has increased over time, the corresponding circuitry has become increasingly dense and complex. As a result, electronic control units have been migrating from the use of two-layer printed circuit boards to the use of four-layer printed circuit boards. One result of four-layer printed circuit boards is increased thickness. Thicker flexible circuit boards are known to crack or split when bent, resulting in a control unit that must be discarded. Discarded control units results in excessive manufacturing costs and waste, especially since the printed circuit board must be populated with components before being folded.

Moreover, the type of material used for the substrate will affect the degree of flexibility of the board. For example, a material that is well known in the construction of circuit boards is a type of epoxy glass known as FR4. FR4 has a glass weave impregnated with epoxy resin and is generally known to be relatively stiff. Although FR4 and other more rigid substrates are substantially less expensive than very flexible substrates, the use of more rigid substrates presents the added problem of cracking and splitting when trying to bend the substrate to a confined space.

U.S. Pat. No. 6,292,370, owned by the assignees of the present invention and hereby incorporated by reference herein in its entirety, describes that cracking and other damage may be avoided by heating the substrate to within about 10° C. of the glass transition temperature of the FR4 material. The reference recites that this may be accomplished by passing the circuit substrate through an oven.

A need exists, however, for improved devices and methods for increasing the flexibility of more rigid substrates to reduce splitting and cracking. For instance, a need exists to reduce the cost in the energy expended in passing the circuit substrate through an oven and to reduce the risk of damage to components on the substrate. There is also a need to reduce the time needed to heat up the substrate over the known method of passing the circuit substrate through an oven. It is, therefore, desirable to provide an improved device and method of heating a substrate to overcome most, if not all, of the preceding problems.

BRIEF DESCRIPTION OF THE DRAWINGS

FIGS. 7A–7D are graphic representations of the bending of a circuit board during various stages of a manufacturing process;

FIG. 9 is an exploded perspective view of an electronic control unit according to one embodiment of the present invention;

FIG. 10 is a side view of a portion of the electronic control unit in FIG. 9;

FIG. 11 is an exploded perspective view of an electronic control unit according to another embodiment of the present invention; and FIG. 12 is a side view of a portion of the electronic control unit in FIG. 11.

Figure 1:
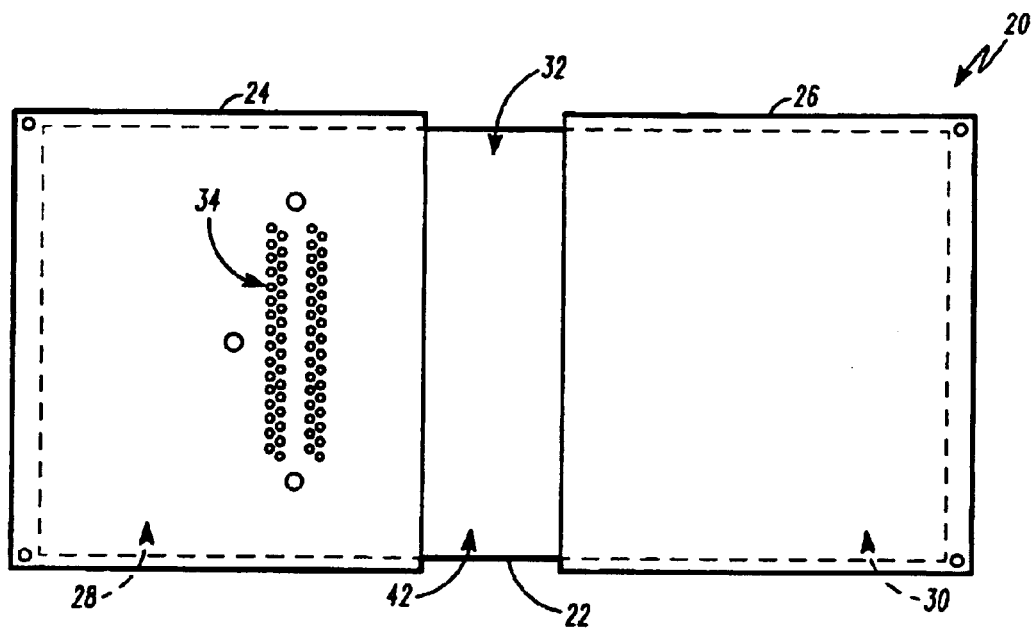
FIG. 1 is a plan view of a circuit board used in one embodiment of the present invention.

While the invention is susceptible to various modifications and alternative forms, specific embodiments have been shown by way of example in the drawings and will be described in detail herein. However, it should be understood that the invention is not intended to be limited to the particular forms disclosed. Rather, the invention is to cover all modifications, equivalents and alternatives falling within the spirit and scope of the invention as defined by the appended claims.

DETAILED DESCRIPTION

What is described is a device and method for bending a circuit board through localized heating. For purposes of illustration, an example of the device and method will be described in the context of an electronic control unit for a vehicle. However, the present invention is not limited to units for vehicles but may also apply to other housings or devices where flexibility of a circuit board is needed.

To this end, generally, in one embodiment there is a system for bending a substantially rigid substrate. The substantially rigid substrate has a first portion and a second portion interconnected by a bend region. The system comprises a first heated die member and a second heated die member. The first heated die member has a longitudinal body portion and an outer edge portion. The outer edge portion extends along the longitudinal body portion and is substantially rounded. The first heated die member is configured to contact a first side of the bend region of the substrate. The second heated die member has a longitudinal body portion and a groove. The groove extends along the longitudinal body portion. The second heated die member is configured to contact a second side of the bend region of the substrate. The first heated die member and the second heated die member are capable of bending the substrate in the bend region when the outer edge portion of the first heated die member slides into the groove of the second heated die member.

The first portion of the substrate may be attached to a first rigidizer portion and the second portion of the substrate may be attached to a second rigidizer portion. The first heated die member may be attached to a transfer mechanism wherein the transfer mechanism has arms that holds the first rigidizer portion and the second rigidizer portion. The second heated die member may be attached to a workstation wherein the workstation includes at least a frame, a first surface, and a second surface. In this case, the first surface and the second surface may be slidably attached to the frame and the second heated die member positioned between the first surface and the second surface. Moreover, the first surface and the second surface may also be rotatably attached to a base.

In another embodiment, there is a system for bending a substantially rigid substrate that has a first portion and a second portion interconnected by a bend region. The first portion of the substrate is attached to a first rigidizer portion and the second portion of the substrate is attached to a second rigidizer portion. The system comprises a first mechanism and a second mechanism. The first mechanism has a first die member. The first die member has a longitudinal body portion and an outer edge portion. The outer edge portion extends along the longitudinal body portion and is substantially rounded. The second mechanism has a second die member, a first surface, and a second surface. The second die member is positioned between the first surface and the second surface. The second die member has a longitudinal body portion and a groove. The groove extends along the longitudinal body portion of the second die member. The first die member and the second die member are capable of bending the substrate in the bend region when the outer edge portion of the first die member slides into the groove of the second die member.

There is also a method for bending a substantially rigid substrate having a first portion and a second portion interconnected by a bend region. The method comprises the steps of: providing a first heated die member having a longitudinal body portion and an outer edge portion, the outer edge portion extending along the longitudinal body portion and being substantially rounded; contacting the first heated die member to a first side of the bend region of the substrate; providing a second heating die member having a longitudinal body portion and a groove, the groove extending along the longitudinal body portion; contacting the second heated die member to a second side of the bend region of the substrate; and sliding the outer edge portion of the first heated die member into the groove of the second heated die member such that at least a portion of the bend region of the substrate extends into groove of the second heated die member.

The method may further comprise a step of waiting for a predetermined dwell time after the steps of contacting the first heated die member and the second heated die member to the substrate. The method may also comprise a step of sliding the first portion of the substrate and the second portion of the substrate toward the second heated die member during the step of sliding the first heated die member into the second heated die member. The method may further comprise a step of rotating the first portion of the substrate relative to the second portion of the substrate after the step of sliding the first heated die member into the second heated die member.

There is also a method for assembling an electronic control unit comprising the steps of: providing a substantially rigid substrate having a first portion and a second portion interconnected by a bend region; attaching the first portion of the substrate to a first rigidizer portion; attaching the second portion of the substrate to a second rigidizer portion; providing a first heated die member having a longitudinal body portion and an outer edge portion, the outer edge portion extending along the longitudinal body portion and being substantially rounded; contacting the first heated die member to a first side of the bend region of the substrate; providing a second heated die member having a longitudinal body portion and a groove, the groove extending along the longitudinal body portion; contacting the second heated die member to a second side of the bend region of the substrate; sliding the outer edge portion of the first heated die member into the groove of the second heated die member such that at least a portion of the bend region of the substrate extends into the groove of the second heated die member; folding the first portion of the substrate relative to the second portion of the substrate to form at least one bend in the bend region; and attaching a sidewall rigidizer to the first rigidizer portion and the second rigidizer portion.

Figure 2:
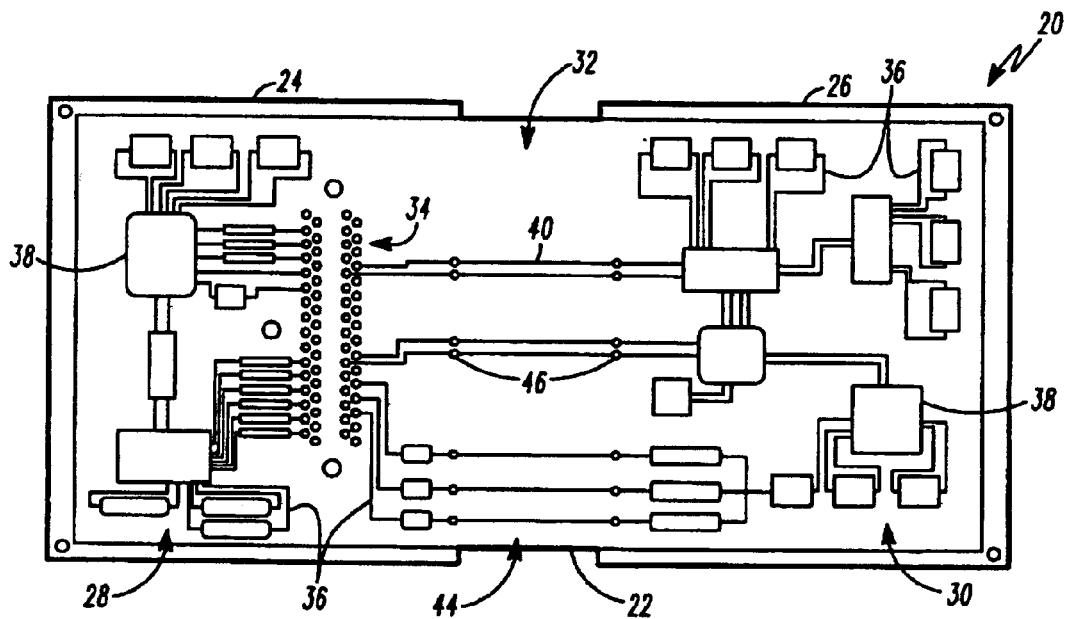
FIG. 2 is a plan view of the opposite side of the circuit board in FIG. 1.

Now, turning to the drawings, an example use of a device and method will be explained in the context of an electronic control unit for a vehicle. FIGS. 1 and 2 show opposite sides of an example circuit board 20 that may reside within an electronic control unit. In one embodiment, generally, the circuit board 20 has a substantially rigid substrate 22, a first rigidizer portion 24, and a second rigidizer portion 26. The substantially rigid substrate 22 has a first portion 28 and a second portion 30 that is interconnected by a bend region 32. The substantially rigid substrate 22 may be made of FR4 or other more rigid organic based substrates. FR4 is a material having at least one layer of glass weaves impregnated with epoxy resin. Other types of epoxy glass and polyimides are also commercially available. The substantially rigid substrate 22 may also be made of multiple layers of a substrate material laminated together that make the substrate more stiff or brittle. Although not critical to this invention, at least one of the rigidizer portions 24, 26 may have a plurality of holes 34 to fit a connector (not shown). In this embodiment, the first portion 28 of the substrate 22 is attached to the first rigidizer portion 24. The second portion 30 of the substrate 22 is attached to the second rigidizer portion 26.

FIG. 2 shows the opposite side of the substrate 22. On the opposite side of the substrate 22, a plurality of conductive traces 36 are formed on, or within, the first portion 28 and second portion 30 of the substrate 22. The conductive traces 36 interconnect a plurality of electronic components 38 mounted on the substrate 22. The electronic components 38 may be any electronic component or device that can be mounted to a printed circuit board such as, for example, a battery, a capacitor, a resistor, a semiconductor chip, a diode, an inductor, and a coil. The conductive traces 36 are also electrically attached to the connector holes 34 for attachment to external connector pins (not shown). It will be appreciated by one of ordinary skill in the art, with the benefit of this disclosure, that the exact layout of the conductive traces 36 and the number of components 38 is not critical, but that the present invention can be used for many types of electrical circuits without departing from the spirit and scope of the present invention.

In the bend region 32 of the substrate 22, a series of connecting traces 40 are formed to interconnect the conductive traces 36 formed on the first portion 28 and second portion 30 of the substrate 22. Advantageously, the conductive traces 36 and the connecting traces 40 may, in one embodiment, be formed and covered with a rigid solder mask. That is, solder mask having an elongation of less than 10 percent. Typically, flexible circuits require the use of flexible solder mask, i.e. solder mask having an elongation of up to 30 percent to account for tensile stress introduced in flexing the circuit board. Flexible solder mask, however, is substantially more expensive than rigid solder mask.

In one embodiment, the bend region 32 has a first side 42 (FIG. 1) and a second side 44 (FIG. 2). If the substrate 22 is made of FR4 material, the substrate 22 will have at least one layer of glass weave impregnated with resin. On each side of the layer in the bend region, there should be a layer of epoxy. This epoxy layer may be resin-coated copper (RCC) that is commercially available with FR4 substrate material. Formed on, or within, the second side 44 of the bend region 32 are connecting traces 40. The connecting traces 40 may be electrically connected to the conductive traces 36 of the first portion 28 and the second portion 30 of the substrate 22 by vias 46.

Figure 3:
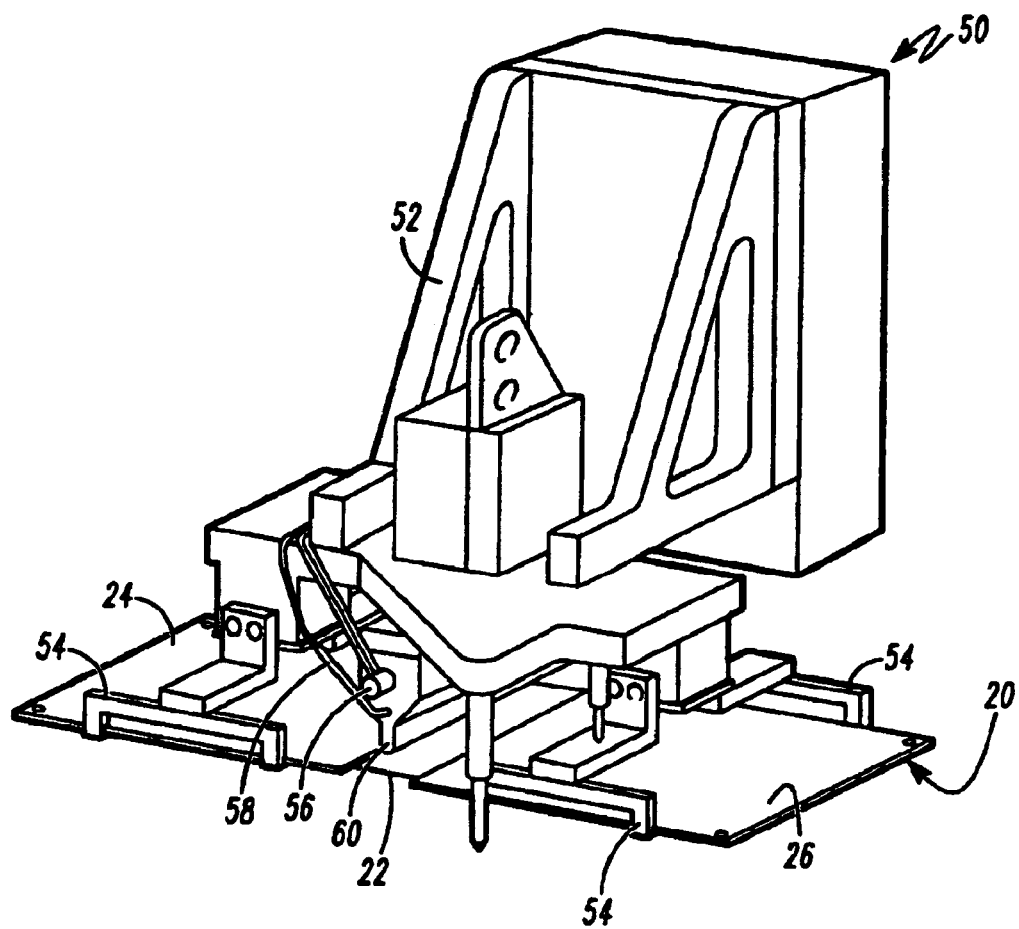
FIG. 3 is a perspective view of a first mechanism having a first die member according to one embodiment of the present invention.
Figure 4:
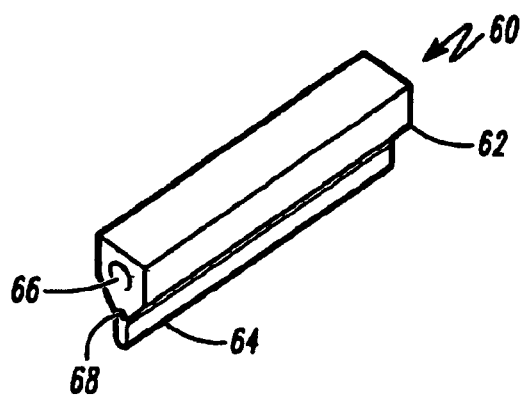
FIG. 4 is a perspective view of the first die member in FIG. 3.
Figure 5:
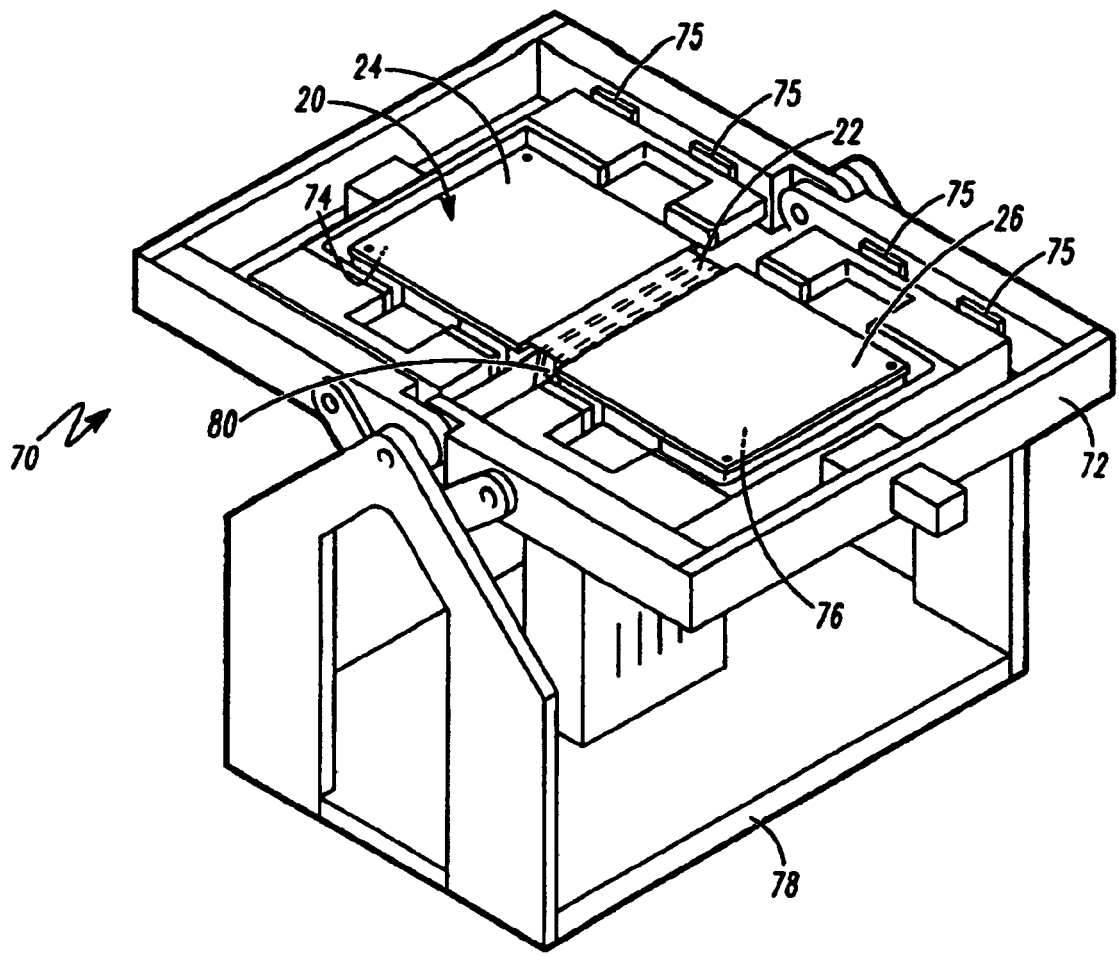
FIG. 5 is a perspective view of a second mechanism having a second die member according to one embodiment of the present invention.
Figure 6:
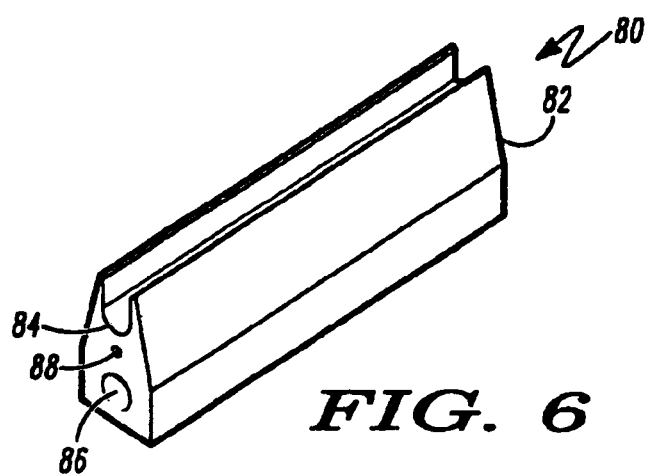
FIG. 6 is a perspective view of the second die member in FIG. 5.

Referring now to FIGS. 3–6, an exemplary system for bending a circuit board 20 is shown. FIG. 3 is a perspective view of a first mechanism 50 in accordance with an embodiment of the present invention. FIG. 4 is a perspective view of a first die member 60 of the first mechanism 50 in one embodiment. FIG. 5 is a perspective view of a second mechanism 70 in accordance with an embodiment of the present invention. FIG. 6 is a perspective view of a second die member 80 of the second mechanism 70 in one embodiment.

As will be explained below, the first die member 60 and the second die member 80 will be used together to bend the substantially rigid substrate 22 in the bend region 32. The first mechanism 50 and the second mechanism 70 are further used to hold and assist in the bending of the substantially rigid substrate 22.

Referring initially to FIG. 3, in one embodiment, there is a first mechanism 50 having a first die member 60, a support frame 52, a plurality of arms 54, a first heater 56, and a first temperature sensor 58. The first mechanism 50 may be configured to act as a pick and place machine for the transfer of circuit boards 20 from one workstation to another workstation. This is particularly beneficial in high volume production applications. The support frame 52 may be a variety of configurations but is used to support the first die member 60, the plurality of arms 54, and other components. The first die member 60 and the plurality arms 54 may be configured to move in relation to the support frame 52 and activated by electric servos or by pneumatic valves. The plurality of arms 54 may be used for holding and transferring the first rigidizer portion 24 and the second rigidizer portion 26 of the circuit board 20.

In one embodiment, referring to FIG. 4, the first die member 60 has a longitudinal body portion 62 and an outer edge portion 64. The outer edge portion 64 may extend along the longitudinal body portion 62 and be substantially rounded. The first die member 60 is preferably a heated die member. To provide a heated die member, the first die member 60 may have an aperture 66 that extends along a substantial portion of its longitudinal body portion 62. The first heater 56 may be an electric heater that extends within the aperture 66 of the first die member 60. To provide control for heating the first die member 60, the first temperature sensor 58 may also be inserted on, or within, the first die member 60. FIG. 4 shows another aperture 68 that extends along the longitudinal body portion 62 that is capable of receiving the first temperature sensor 58. The electrical output of the first temperature sensor 58 and the power to the first heater 56 may be connected to a controller (not shown) for close loop control of the temperature of the first die member 60. One of the substantial benefits of the present invention is that the heating process described herein is localized and the process may be automated and controlled.

Referring to FIG. 5, in one embodiment, there is a second mechanism 70 having a second die member 80, a support frame 72, a first surface 74, a second surface 76, and a base 78. The second mechanism 70 may be configured to act as a workstation to hold circuit boards 20 received from the first mechanism 50. This is particularly beneficial in high volume production applications.

The support frame 72 may be a variety of configurations but is used to support the first surface 74 and the second surface 76. In one embodiment, the support frame 72 include linear slides 75. The linear slides 75 allow the first surface 74 and the second surface 76 to be slidably attached to the support frame 72. The second die member 80 may be positioned between the first surface 74 and the second surface 76. The first surface 74 and the second surface are capable of being attached to the circuit board 20. The attachment may be accomplished by different methods but, in one embodiment, the circuit board 20 is pneumatically clamped on its sides at the first rigidizer portion 24 and the second rigidizer portion 26.

The base 78 may be used to hold the support frame 72 and the second die member 80. In one embodiment, as shown in FIG. 5 and further explained below, the support frame 72 is rotatably attached to the base 78. In particular, the attachment allows the first surface 74 on the support frame 72 to be rotated relative to the second surface 76 on the support frame 72.

In one embodiment, referring to FIG. 6, the second die member 80 has a longitudinal body portion 82 and a groove 84. The groove 84 may extend along the longitudinal body portion 82 and have a bottom surface that is substantially rounded. The second die member 80 is preferably a heated die member. To provide a heated die member, the second die member 80 may have an aperture 86 that extends along a substantial portion of its longitudinal body portion 82. The aperture 86 is configured to receive a second heater (not shown). The second heater may be an electric heater that extends within the aperture 86 of the second die member 80. To provide control for heating the second die member 80, a temperature sensor may also be inserted on, or within, the second die member 80. FIG. 6 shows another aperture 88 that extends along the longitudinal body portion 82 that is capable of receiving the temperature sensor. The electrical output of the temperature sensor and the power to the heater may be connected to a controller (not shown) that is capable of controlling the temperature of the second die member 80 to a desired temperature.

Figure 8:
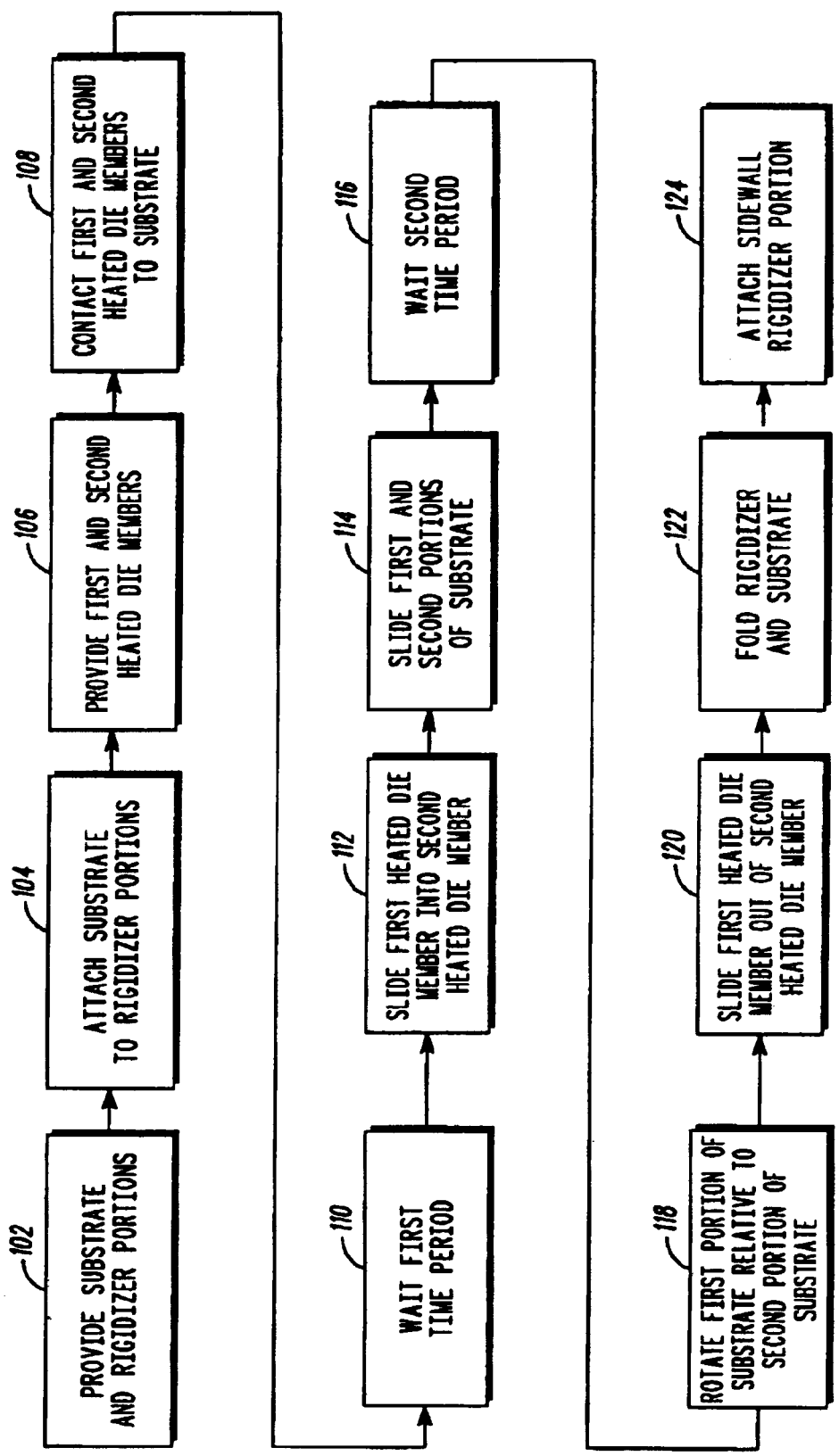
FIG. 8 is a process flow diagram that illustrates one embodiment of making an electronic control unit, including the bending of a circuit board.

FIGS. 7A–7D and FIG. 8 illustrate a suitable method for bending a circuit board 20 using the first mechanism 50 and the second mechanism 70 as described above. FIGS. 7A–D are graphic representations of the bending of the circuit board 20 during various stages of the manufacturing process. FIG. 8 is a process flow diagram the further illustrates how the bending of the circuit board 20 may fit into the manufacture of an electronic control unit.

For purposes of illustration, the method for bending a circuit board 20 will be described in the context of an electronic control unit for a vehicle. In block 102, the process includes providing a substantially rigid substrate 22 having a first portion 28 and a second portion 30 interconnected by a bend region 32. There is also provided a first rigidizer portion 24 and a second rigidizer portion 26.

In block 104, the process includes attaching the first portion 28 of the substrate 22 to the first rigidizer portion 24 and attaching the second portion 30 of the substrate 22 to the second rigidizer portion 26. In one embodiment, the attachment may be secured by an adhesive such as a pressure sensitive adhesive (PSA) tape or film. In another embodiment, the adhesive may be a heat curable, liquid adhesive that is screen printed on the first rigidizer portion 24 and the second rigidizer portion 26. Those who are of ordinary skill in the art, having the benefit of this disclosure, will realize that there are many techniques for securing the substrate to the rigidizer, such as mechanical fasteners like screws or other adhesive laminates that may be placed on the rigidizer, that may be used herein without departing from the spirit and scope of the present invention.

In block 106, the process also includes providing a first heated die member 60 and a second heated die member 80. The first heated die member 60 and the second heated die member 80 is preferably made of a material that conducts and retains heat such as aluminum. The first heated die member 60 has a longitudinal body portion 62 and an outer edge portion 64. The outer edge portion 64 extends along the longitudinal body portion 62 and is substantially rounded. The second heated die member 80 as a longitudinal body portion 82 and a groove 84. The groove 84 extends along the longitudinal body portion 82. This is further shown in FIG. 7A.

In block 108, the process further includes contacting the first heated die member 60 to a first side 42 of the bend region 32 of the substrate 22 and contacting the second heated die member 80 to a second side 44 of the bend region 32. This is further shown in FIG. 7B. At this point, as indicated in block 110, the process may further include waiting a first time period. The first time period should represent a predetermined dwell time. In one application for FR4 material, a suitable dwell time was selected to be around 10 seconds.

In block 112, the process includes sliding the outer edge portion 64 of the first heated die member 60 into the groove 84 of the second heated die member 80 such that at least a portion of the bend region 32 of the substrate 22 extends into the groove 84 of the second heated die member 80. This is further illustrated in FIG. 7C. During this step, as indicated in block 114, it is preferred that the first portion 28 of the substrate 22 and the second portion 30 of the substrate 22 slide toward the second heated die member 80, also illustrated in FIG. 7C. At this point, as indicated in block 116, the process may further include waiting a second time period. The second time period should represent a further predetermined dwell time to form the bend. In one application for FR4 material, a suitable second dwell time was selected to be around 10 seconds.

Thereafter, in block 118, the method may further comprise of the step of rotating the first portion 28 of the substrate 22 relative to the second portion 30 of the substrate 22. Although the degree of rotation may be implementation specific, in one embodiment for FR4 material in forming a W-shaped bend, each of the first portion 28 and the second portion 30 were rotated about 45 degrees. This is illustrated in FIG. 7D. In block 120, the process may then include a step of sliding the outer edge portion 64 of the first heated die member 60 out of the groove 84 of the second heated die member 80.

In block 122, the process may also include folding the first portion 28 of the substrate 22 relative to the second portion 30 of the substrate 22 to form at least one bend in the bend region 32. Additionally, in block 124, the process of making an electronic control unit may further include attaching a sidewall rigidizer portion to the first rigidizer portion 24 and the second rigidizer portion 26. These steps are further illustrated and discussed below in relation to FIGS. 9–10.

FIG. 9 shows an exploded perspective view of an electronic control unit 90. The rigidizer portions 24, 26 described above are designed to shield the substrate 22 and electronic components 38 from electrical charge that can damage the substrate and components. The rigidizer portions 24, 26 are used in connection with a sidewall portion 92, 94 to further interconnect the first rigidizer portion 24 and the second rigidizer portion 26. The sidewall portion 92, 94 may be attached to the first rigidizer portion 24 and the second rigidizer portion 26 by a solder or weld. The attachment may also be secured through mechanical fasteners such as screws or an adhesive. The rigidizer portions may also provide mechanical support and conductively dissipate heat for the substrate 22.

Preferably, the rigidizer portions 24, 26, 92, 94 are manufactured from materials that are rigid enough to provide a rigid mechanical support for the substrate 22. In automobile applications, the rigidizer portions 24, 26, 92, 94 should also be designed to shield the electronic components 38 from heat, water, chemicals, and electrostatic charge. Suitable materials for the rigidizer portions are aluminum, steel, engineering grade plastic, magnesium, and zinc or any material that is resistant to chemicals and elements commonly found in an automobile. Preferably, the rigidizer portions are further manufactured from thermally conductive materials and conductively transfers heat by components 38 during operation of the electronic control unit 90. However, those of ordinary skill in the art will realize that electronic control unit 90 may be used in low power operations where thermal issues, and the thermal conductivity of rigidizer may be of minor importance.

Referring to FIG. 10, as explained above, substrate 22 is preferably made from a relatively rigid material such as FR4 or a multi-layer polyimide material. The first die member 60 and the second die member 80 described above are used at the bend region 32 of the substrate 22. This will allow the first portion 28 of the substrate 22 to be folded relative to the second portion 30 of the substrate 22.

It will be appreciated that the present invention provides the significant advantage of locally heating the bend region 32 of the substrate 22. It limits the heating to only the part of the substrate that needs to be bent. It uses a first die member 60 and a second die member 80 that requires reduced amounts of energy to heat the bend region 32, thereby reducing manufacturing costs. Additionally, the time constant for heating is very short compared to baking the entire board in an oven. Little soak time is needed to heat the bend region 32 because the thermal mass is much smaller.

It also has been found by the inventor that localized heating permits bending at a much lower temperature than that required in previous methods. For instance, an FR4 material may have a glass transition temperature of about 150° C. It has been known to heat the entire board in an oven to within 10° C. of the glass transition prior to bending the substrate. However, it has been found, through the present invention, that a local heating of bend region 32 of FR4 material would permit suitable bending at temperatures of 120° C. Accordingly, less energy is used to permit bending of the substrate 22. In fact, in tests, it has been discovered that heating of the substrate 22 may not even be required depending on the application and the desired result on manufacturing yields.

After using the first die member 60 and the second die member 80, and the substrate 22 is folded at the bend region 32, the actual bend formed at the bend region 32 may take a variety of shapes. For example, in FIGS. 9 and 10, there is a bend that is in a W-shape. The W-shape permits very compact folding that can be of particular importance for automotive and other industrial applications.

Referring now to FIGS. 11 and 12, another type of bend is shown in the bend region 32 of the substrate 22. FIG. 11 is an exploded perspective view of an electronic control unit 190 in accordance with another embodiment of the present invention. FIG. 12 is a side view of a portion of the electronic control unit 190. The electronic control unit 190 has a substrate 22, a first rigidizer portion 24 and a second rigidizer portion 26. Here, however, the sidewall rigidizer portion 194 has a depression 196. If the rigidizer is made of sheet aluminum, the depression 196 may be formed in the sidewall rigidizer portion 194 by a stamping process.

The presence of the depression 196 permits the bend in the bend region 32 of the substrate 22 to be U-shaped. The depression 196 is used for housing at least a portion of the bend in the bend region 32 of the substrate 22. This U-shape also permits very compact folding that can be of particular importance for automotive and other industrial applications. The U-shape bend may be formed during the assembly process by flipping the circuit board 20 on its opposite side and going through steps similar to that shown in FIGS. 7A–7C. In the step shown in FIG. 7D, instead of rotating the ends of the circuit board 20 downward, the ends of the circuit board 20 should be rotated upward to form the U-shaped bend. The bend region 32 of the substrate 22 need not be physically attached to the sidewall rigidizer portion 194 or the depression 196. When the first portion 28 of the substrate 22 is folded relative to the second portion 30 of the substrate 22, this will form the U-shape bend as shown in FIGS. 11 and 12.

What has been described is a device and method for increasing the flexibility of a circuit board through localized heating. The device and method permits relatively small radii bends so that the circuit board may be more compactly folded than what could otherwise be accomplished using FR4 or similar relatively brittle materials. The alternative is to use single layer polyimide or similar flexible materials at a substantial cost penalty. The present invention also permits localized heating of only the area that requires the bend. This reduces the amount of energy needed for assembly costs that can be of particular interest in high volume production.

The above description of the present invention is intended to be exemplary only and is not intended to limit the scope of any patent issuing from this application. For example, the present discussion used an electronic control unit to illustrate the device and method of the present invention. The present invention is also applicable to other applications that use flexible circuits that need to be confined to a small area. The present invention is intended to be limited only by the scope and spirit of the following claims.

What is claimed is:

1. A system for bending a substantially rigid substrate, the substantially rigid substrate having a first portion and a second portion interconnected by a bend region, the system comprising:
   a rigidizer with first and second portions and with an attached sidewall rigidizer, the first and second portions of the substrate being attached to the respective first and second rigidizer portions,
   a first heated die member having a longitudinal body portion and an outer edge portion, the outer edge portion extending along the longitudinal body portion and being substantially rounded, the first heated die member configured to contact a first side of the bend region of the substrate; and
   a second heated die member having a longitudinal body portion and a groove, the groove extending along the longitudinal body portion, the second heated die member configured to contact a second side of the bend region of the substrate;
   wherein the first heated die member and the second heated die member are capable of folding the first portion of the substrate relative to the second portion of the substrate to form at least one bend in the bend region when the outer edge portion of the first heated die member slides into the groove of the second heated die member.

2. The system of claim 1 wherein the substantially rigid substrate is made of at least one layer of glass weave impregnated with epoxy resin.

3. The system of claim 1 wherein the substantially rigid substrate has multiple layers having at least one layer of a polyimide material.

4. The system of claim 1 wherein the first portion and the second portion of the substrate are formed with conductive traces for interconnecting a plurality of electronic components, the bend region of the substrate formed with connecting traces for interconnecting the conductive traces formed on the first portion of the substrate with the conductive traces formed on the second portion of the substrate.

5. The system of claim 1 wherein the first heated die member is attached to a transfer mechanism, the transfer mechanism having arms to hold the first rigidizer portion and the second rigidizer portion.

6. The system of the second heated die member is attached to a workstation, the workstation having at least a frame, a first surface, and a second surface, the first surface and the second surface being slidably attached to the frame, the second heated die member positioned between the first surface and the second surface.

7. The system of claim 5 wherein the second heated die member is attached to a workstation, the workstation having at least a base, a first surface, and a second surface, the first surface and the second surface being rotatably attached to the base, the second heated die member positioned between the first surface and the second surface.

8. The system of claim 1 wherein the first heated die member and the second heated die member are capable of bending the substrate in a W-shape.

9. The system of claim 1 wherein the first heated die member and the second heated die member are capable of bending the substrate in a U-shape.

10. The system of claim 1 wherein the first die member is heated by an electric heater that extends within an aperture of the first die member, the aperture extending along a substantial portion of the longitudinal body portion of the first die member.

11. The system of claim 1 wherein the second die member is heated by an electric heater that extends within an aperture of the second die member, the aperture extending along a substantial portion of the longitudinal body portion of the second die member.

12. A method for assembling an electronic control unit comprising the steps of:

provingly a substantially rigid substrate having a first portion and a second portion interconnected by a bend region;

attaching the first portion of the substrate to a first rigidizer portion;

attaching the second portion of the substrate to a second rigidizer portion;

providing a first heated die member having a longitudinal body portion and an outer edge portion, the outer edge portion extending along the longitudinal body portion and being substantially rounded;

contacting the first heated die member to a first side of the bend region of the substrate;

providing a second heated die member having a longitudinal body portion and a groove, the groove extending along the longitudinal body portion;

contacting the second heated die member to a second side of the bend region of the substrate;

sliding the outer edge portion of the first heated die member into the groove of the second heated die member such that at least a portion of the bend region of the substrate extends into the groove of the second heated die member;

folding the first portion of the substrate relative to the second portion of the substrate to form at least one bend in the bend region; and attaching a sidewall rigidizer to the first rigidizer portion and the second rigidizer portion.

13. The method of claim 12 wherein the substantially rigid substrate is made of at least one layer of glass weave impregnated with epoxy resin.

14. The method of claim 12 wherein the substantially rigid substrate has multiple layers having at least one layer of a polyimide material.

15. The method of claim 12 wherein the step of attaching the first portion of the substrate to the first rigidizer portion and the step of attaching the second portion of the substrate to the second rigidizer portion includes the use of a pressure sensitive adhesive.

16. The method of claim 12 further comprising the step of waiting for a predetermined dwell time after the steps of contacting the first heated die member to a first side of the bend region of the substrate and contacting the second heated die member to a second side of the bend region of the substrate.

17. The method of claim 12 further comprising the step of waiting for a predetermined dwell time before the step of sliding the outer edge portion of the first heated die member into the groove of the second heated die member.

18. The method of claim 12 further comprising the step of sliding the first portion of the substrate and the second portion of the substrate toward the second heated die member during the step of sliding the outer edge portion of the first heated die member into the groove of the second heated die member.

19. The method of claim 12 further comprising the step of rotating the first portion of the substrate relative to the second portion of the substrate after the step of sliding the outer edge portion of the first heated die member into the groove of the second heated die member.

* * * * *

UNITED STATES PATENT AND TRADEMARK OFFICE
CERTIFICATE OF CORRECTION

PATENT NO. : 6,908,583 B2
DATED : June 21, 2005
INVENTOR(S) : Fielder et al.

It is certified that error appears in the above-identified patent and that said Letters Patent is hereby corrected as shown below:

Column 10,
Line 45, change "The system of the second heated die member is attached" to -- The system of claim 5 wherein the second heated die member is attached --.

Signed and Sealed this

Sixth Day of December, 2005

JON W. DUDAS
*Director of the United States Patent and Trademark Office*